(12) United States Patent
Xiaogang et al.

(10) Patent No.: US 11,412,634 B2
(45) Date of Patent: Aug. 9, 2022

(54) SELF-LOCKING AND FOLDABLE EJECTOR ARM

(71) Applicant: Cisco Technology, Inc., San Jose, CA (US)

(72) Inventors: Li Xiaogang, Shanghai (CN); Robert Gregory Twiss, Chapel Hill, NC (US); Luyao Wang, Shanghai (CN)

(73) Assignee: CISCO TECHNOLOGY, INC., San Jose, CA (US)

( * ) Notice: Subject to any disclaimer, the term of this patent is extended or adjusted under 35 U.S.C. 154(b) by 71 days.

(21) Appl. No.: 16/808,555

(22) Filed: Mar. 4, 2020

(65) Prior Publication Data

US 2021/0282291 A1 Sep. 9, 2021

(51) Int. Cl.
*H05K 7/14* (2006.01)
*E05C 3/06* (2006.01)
*E05B 13/00* (2006.01)

(52) U.S. Cl.
CPC ......... *H05K 7/1489* (2013.01); *E05B 13/005* (2013.01); *E05C 3/06* (2013.01); *H05K 7/1401* (2013.01)

(58) Field of Classification Search
CPC .................................................. H05K 7/1049
See application file for complete search history.

(56) References Cited

U.S. PATENT DOCUMENTS

| 6,266,248 | B1 | 7/2001 | Hanas et al. | |
|---|---|---|---|---|
| 7,064,959 | B2 | 6/2006 | Kim | |
| 7,325,975 | B2 | 2/2008 | Yamada et al. | |
| 7,402,070 | B1 | 7/2008 | Wu | |
| 9,203,188 | B1 | 12/2015 | Siechen et al. | |
| 2004/0242039 | A1* | 12/2004 | Griffin | H05K 7/1409 439/157 |
| 2006/0012965 | A1* | 1/2006 | Beall | H05K 7/1409 361/726 |

* cited by examiner

*Primary Examiner* — Jerry Wu
(74) *Attorney, Agent, or Firm* — Edell, Shapiro & Finnan, LLC

(57) ABSTRACT

A locking mechanism for securing a computing device in an enclosure includes a jaw, a transmission lever, and an arm. The jaw is configured to abut a portion of the enclosure for holding the computing device. The transmission lever includes an arm pivot at one end and an actuating pivot at the opposite end. The arm is configured to rotate open and closed about the arm pivot and be selectively decoupled from the transmission lever. When the arm is coupled to the transmission lever, opening the arm causes the transmission lever to rotate open about the actuating pivot. Rotating open the transmission lever about the actuating pivot releases the jaw from the portion of the enclosure, and allows the computing device to be removed from the enclosure.

15 Claims, 7 Drawing Sheets

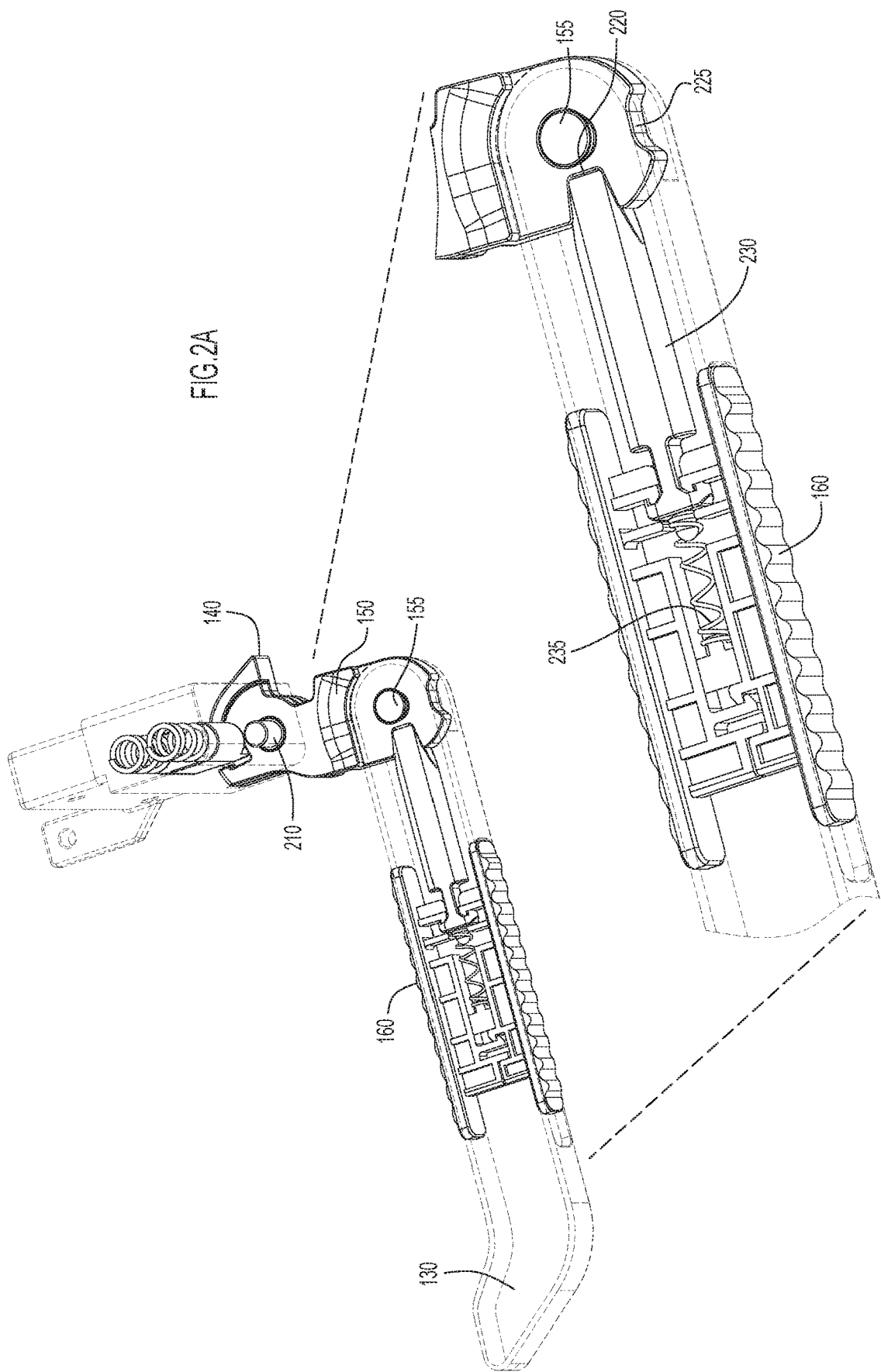

SELF-LOCKING AND FOLDABLE EJECTOR ARM

TECHNICAL FIELD

The present disclosure relates to locking mechanisms for computing devices housed in enclosures.

BACKGROUND

Large scale users of computing devices, such as data center operators, typically mount computing devices in rack enclosures with standardized dimensions and/or connection points. Computing devices, such as network switches and routers, often adopt a modular design due to high development costs, large data transmission demands, and the need for installation flexibility as business requirements change. Typical network element devices have one engine module and several service modules (e.g., Fast Ethernet (FE), Gigabit Ethernet (GE), optical interface, etc.) based on the needs of the network element. Such modules typically employ multiple connectors to connect functionally to a backplane or other card. Each connector in a module requires a certain mating/unmating force, and as high density contact connectors are deployed, installing and removing the module may require a great force. Additionally, modules are tightly inserted in chassis slots for reliable operation and regulatory compliance, such as to reduce electromagnetic emissions. In practice, an ejector/locking mechanism using the principle of the lever is typically installed at each end of the module to assist with installation and removal of the module.

In typical ejectors, the ejector arm may at least partially obscure ports on the front of the computing device, hindering access to plug cables (e.g., data cables, network cables, optical fiber modules, etc.) into the computing device. Additionally, typical locking mechanisms may use a captive screw to secure the computing device to the chassis, or use an additional locking button. The additional steps to unlock and/or unscrew these locking mechanisms further hinder user friendliness and maintenance of the computing device.

BRIEF DESCRIPTION OF THE DRAWINGS

FIG. 2A illustrates a close in view of a locking mechanism with a selectively decouplable arm in a coupled position, according to an example embodiment.

DESCRIPTION OF EXAMPLE EMBODIMENTS

Overview

A locking mechanism for securing a computing device in an enclosure comprises a jaw, a transmission lever, and an arm. The jaw is configured to abut a portion of the enclosure for holding the computing device. The transmission lever comprises an arm pivot at a first end and an actuating pivot at a second end. The arm is configured to rotate about the arm pivot in an opening direction and a closing direction. The arm is also configured to be selectively decoupled from the transmission lever. When the arm is coupled to the transmission lever, rotating the arm in the opening direction causes the transmission lever to rotate in the opening direction about the actuating pivot. Rotating the transmission lever about the actuating pivot in the opening direction releases the jaw from the portion of the enclosure, and enables the computing device to be removed from the enclosure.

Example Embodiments

In typical chassis-mounted modules, the ejector arm of the module may impede access to the front panel of the module. Conversely, when a large number of cables (e.g., Ethernet cables) are plugged in to the front panel of the module, the cables may interfere with access to a captive screw or other latching mechanism. The locking mechanism and ejector arm described herein allows the arm to be decoupled from the rest of the locking mechanism. By decoupling the arm, a user can rotate the arm to a more accessible position without unlatching the module from the chassis.

Figure 1A:
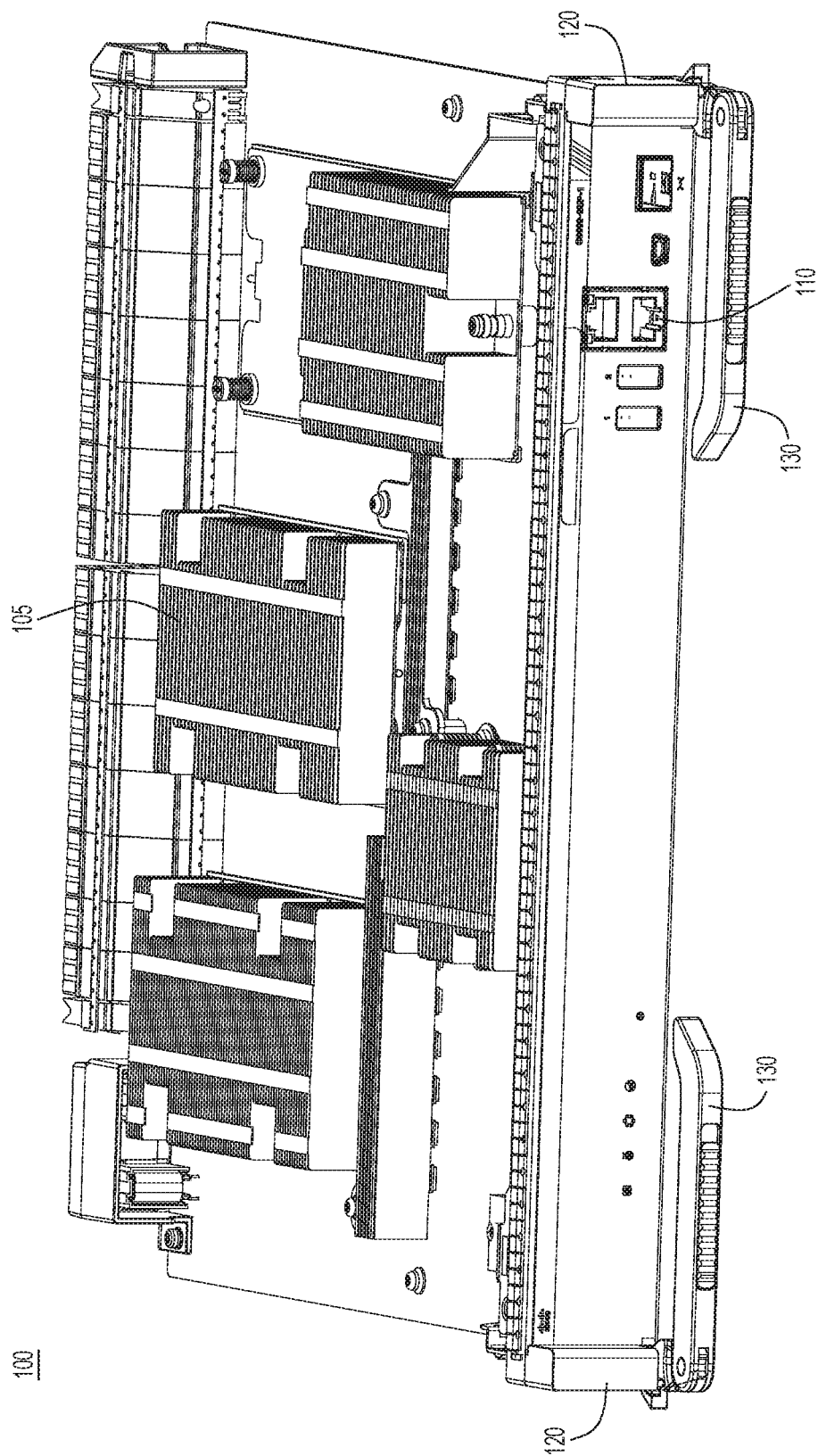
FIG. 1A illustrates an example of a computing device configured to be mounted and locked into an enclosure, according to an example embodiment.

Referring now to FIG. 1A, a chassis-mountable system 100 incorporating the locking mechanism according to one example. The system 100 includes one or more processing modules 105 that process data obtained via one or more network port 110. In one example, the processing module 105 may include a general processing device, an Application Specific Integrated Circuit (ASIC), or other electronic hardware-based or software-based devices configured to process data. The system 100 includes a locking mechanism 120 configured to hold the system securely in an enclosure or chassis (not shown). The system 100 is shown with a locking mechanism 120 on two sides of the system, but other configurations may be used. The locking mechanism 120 is actuated by an arm 130 to lock or unlock the system 100 in the enclosure. In one example, the arm 130 is rotated in an opening direction to unlock the locking mechanism 120 and remove the system 100 from the enclosure. The arm 130 may be rotated in a closing direction to lock the locking mechanism 120 and secure the system 100 in the enclosure.

Figure 1B:
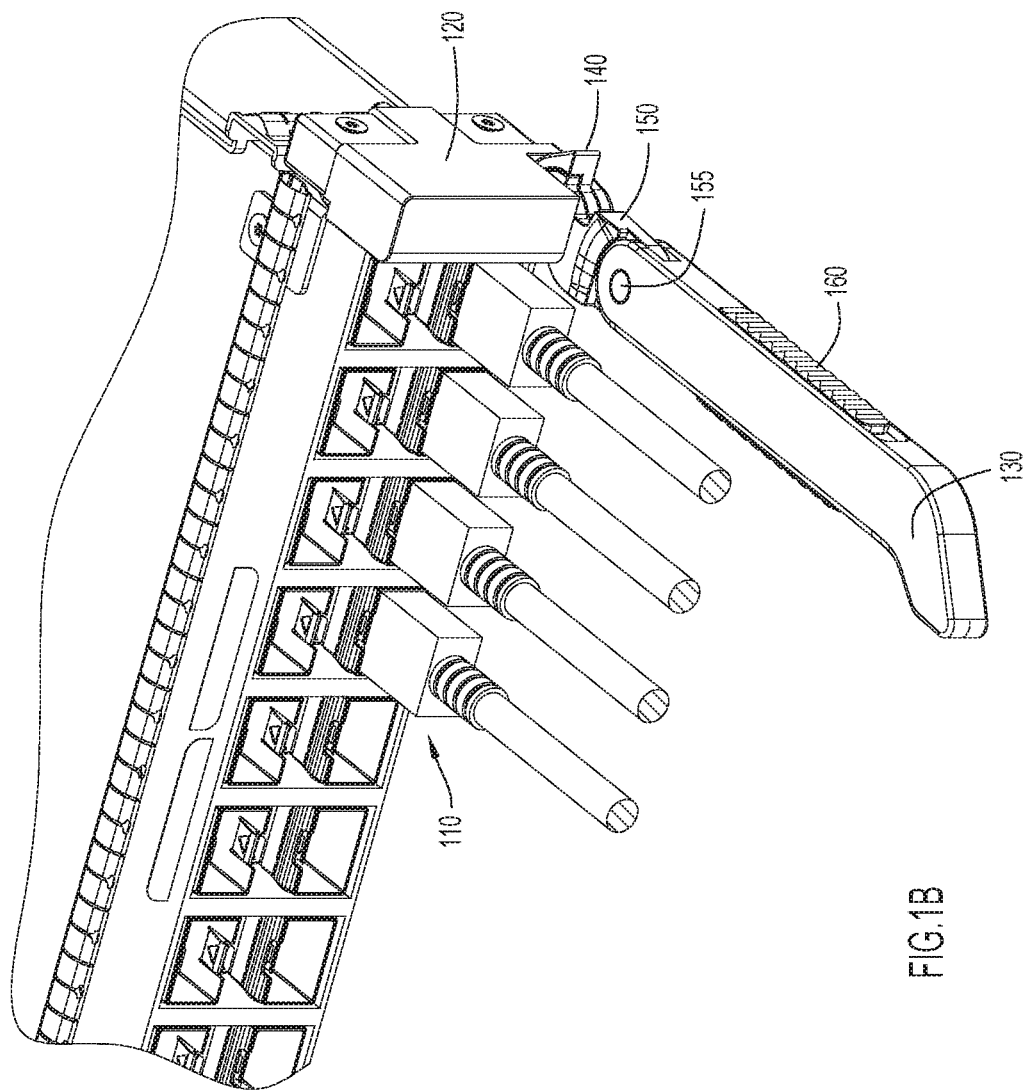
FIG. 1B is a close in view of the computing device with a locking mechanism including a cable management feature, according to an example embodiment.

Referring now to FIG. 1B, a detailed example of the locking mechanism 120 is shown. In addition to the arm 130, the locking mechanism 120 includes a jaw 140 that is configured to be positioned against a portion of the enclosure to lock the system 100 into the enclosure. When the arm 130 is coupled to the rest of the locking mechanism 120, a transmission lever 150 transfers the rotation of the arm 130 to the jaw 140 in order to lock or unlock the jaw 140. The arm 130 may be selectively decoupled from the transmission lever 150, allowing the arm 130 to rotate about an arm pivot 155 in the transmission lever 150. The arm 130 includes a slider 160 that is configured to selectively decouple the arm 130 from the remainder of the locking mechanism 120. Transmission lever 150 may also include one or more detente as radially positioned features that allow arm 130 to occupy pre-set preferred angular positions.

Referring now to FIG. 2A, an example of a mechanism for decoupling the arm 130 from the rest of the locking mechanism 120 is shown in the coupled position. As shown in FIG. 2A, the arm 130 is coupled to the transmission lever 150, preventing the arm 130 from rotating about the arm pivot 155. With the arm 130 coupled to the transmission lever 150, the combination of those two elements rotates about an actuating pivot 210 in the locking mechanism 120. The jaw 140 also rotates about the actuating pivot 210 when pushed by the transmission lever 150.

The transmission lever 150 includes an actuating slot 220 and a detente 225 at the end of the transmission lever 150 with the arm pivot 155. The detente 225 is angularly spaced form the actuating slot 220, and is configured to be shallower than the actuating slot 220 for reasons that will be described hereinafter with respect to FIG. 2B. The arm 130 includes a pin 230 that engages the actuating slot 220 to couple the arm 130 to the transmission lever 150. The slider 160 is coupled to the pin 230 and may be biased toward the transmission lever 150 with a spring 235. When a user selectively decouples the arm 130 from the rest of the locking mechanism 120 by moving the slider 160, the slider 160 pulls the pin 230 from the actuating slot 220, allowing the arm 130 to rotate about the arm pivot 155 separately from the transmission lever 150 without moving the transmission lever 150.

In the example shown in FIG. 2A, the actuating slot 220 has a profile that matches the shape of the pin 230. In another example, the profile of the actuating slot 220 and/or the detente 225 may differ from the shape of the pin 230, while still allowing the actuating slot 220 to capture the pin 230 to couple the transmission lever 150 to the arm 130. For instance, the profile of the actuating slot 220 and/or the detente 225 may bias the pin 230, and the arm 130, to fall into one of the two positions defined by the actuating slot 220 and the detente 225. In other words, the profile of the end of the transmission lever 150 may be shaped to guide the spring-loaded pin 230 away from any position other than the actuating slot 220 or the detente 225.

Figure 2B:
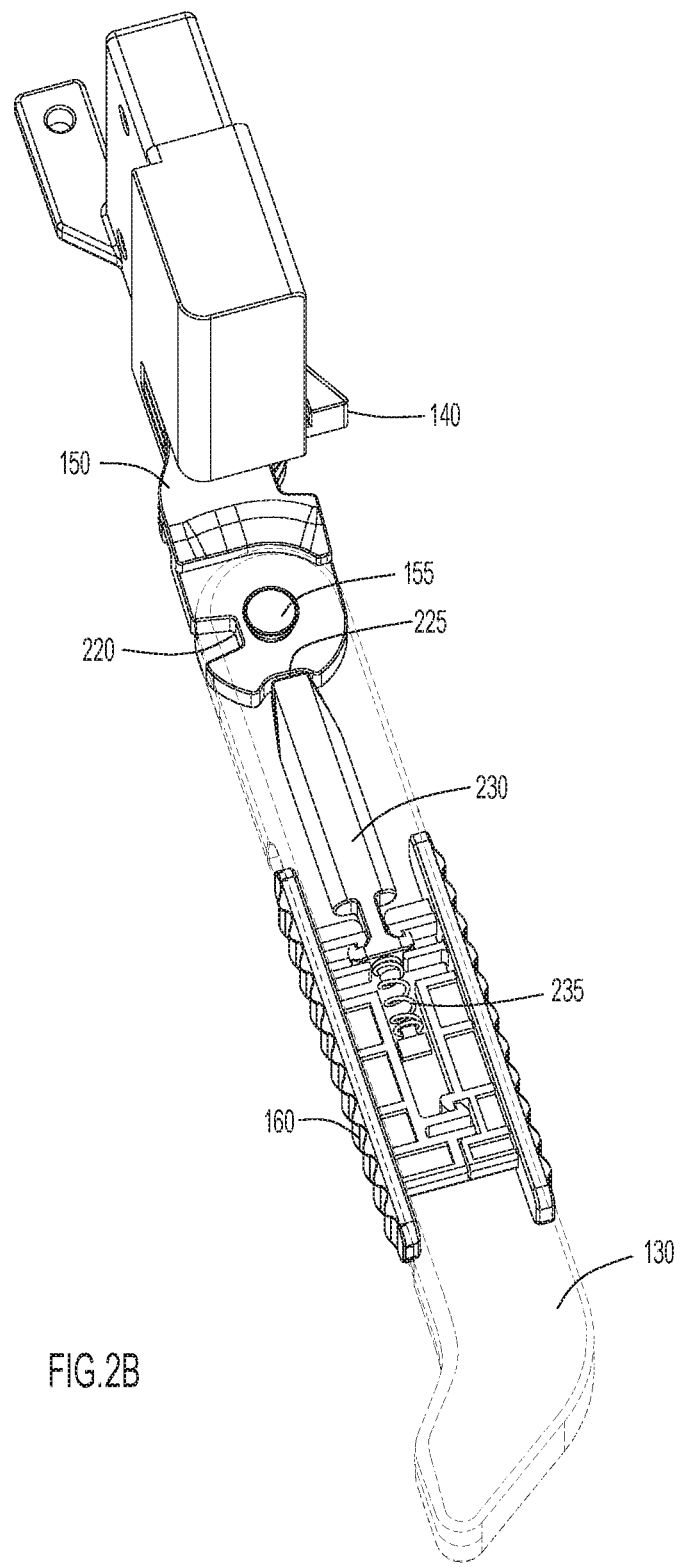
FIG. 2B illustrates a locking mechanism with a selectively decouplable arm in a decoupled position, according to an example embodiment.

Referring now to FIG. 2B, an example of a mechanism for decoupling the arm 130 from the rest of the locking mechanism 120 is shown with the arm 130 in a decoupled position. To decouple the arm 130, the slider 160 has been moved toward the distal end of the arm 130, removing the pin 230 from the actuating slot 220. After the pin 230 is removed from the actuating slot 220, the arm 130 is rotated about the arm pivot 155 without operating the transmission lever 150 or the jaw 140. As shown in FIG. 2B, the arm 130 has been rotated such that the pin 230 is engaged in the detente 225. In one example, the detente 225 is a defeatable detente and rotating the arm 130 will cause the pin 230 to be ejected from the detente 225 without rotating the transmission lever 150.

In another example, the detente 225 is positioned approximately 90° from the actuating slot 220. Then the jaw 140 is locked against the enclosure, the detente 225 may be positioned to bias the arm 130 away from the face of the computing device when the pin 230 is engaged with the detente 225. When the pin 230 is engaged with the actuating slot 220, the arm 130 may be positioned to extend along the face of the computing device.

In a further example, continuing to open the arm 130 so that the pin 230 disengages from the detente 225 causes the arm 130 rotates beyond extending straight out from the computing device. However, if the pin 230 is not engaged with the actuating slot, the arm 130 does not provide sufficient force to release the jaw 140. Additionally, the enclosure may prevent the arm 130 from being over-rotated in this manner. For instance, the enclosure may include side walls or doors that prevent the arm 130 from being rotated significantly beyond the position of the detente 225.

A further example includes a series of defeatable detente features that allow the arm 130 to be temporarily placed at a plurality of angular locations. The series of defeatable detente features may enable the arm 130 to reposition in the different angular locations. Repositioning the arm 130 may allow a user to provide an optimal amount of force and ratchet the transmission lever 150.

Figure 3A:
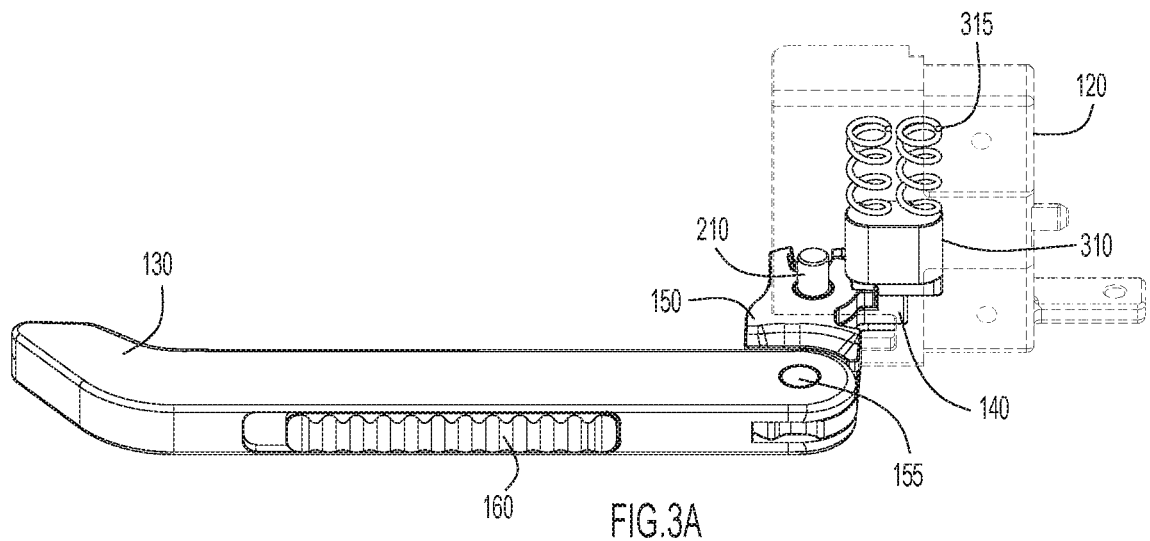
FIGS. 3A-3C illustrate stages of closing a locking mechanism, according to an example embodiment.
Figure 3B:
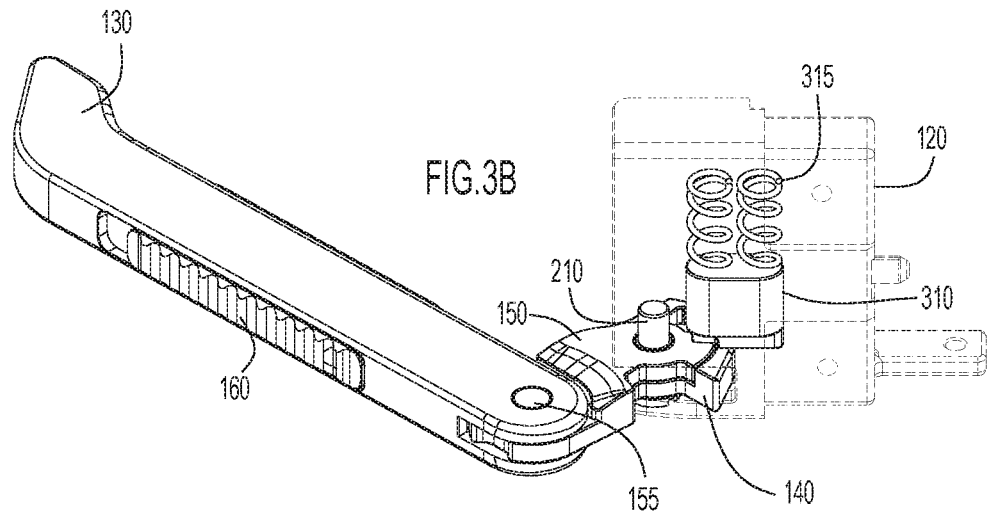
Figure 3C:
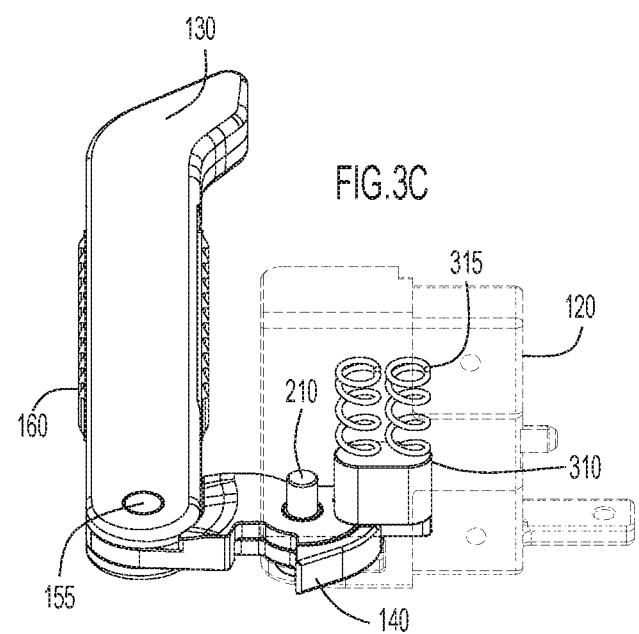

One example of a sequence of rotating the arm 130 to lock the jaw 140 against the enclosure is shown in FIGS. 3A-3C. Referring specifically to FIG. 3A, the locking mechanism 120 is shown in an unlocked initial position. To actuate the locking mechanism 120 and secure the computing device to the enclosure, the arm 130 is coupled to the transmission lever 150 causing both the arm 130 and the transmission lever 150 to rotate about the actuating pivot 210. The locking mechanism 120 includes a wedge 310 that is biased against the transmission lever 150 and jaw 140 by a spring 315.

As the arm 130 and transmission lever 150 are rotated in the closing direction about the actuating pivot 210, the jaw 140 is rotated by the transmission lever 150 and the wedge 310 slides along the top of the transmission lever 150 and the jaw 140, as shown in FIG. 3B. FIG. 3C shows the locking mechanism 120 once the jaw 140 has been rotated to a point that it is securely abutted to the enclosure. At this point, the wedge 310 is pushed into a wedge slot 320, locking the jaw 140 against the enclosure.

Figure 4A:
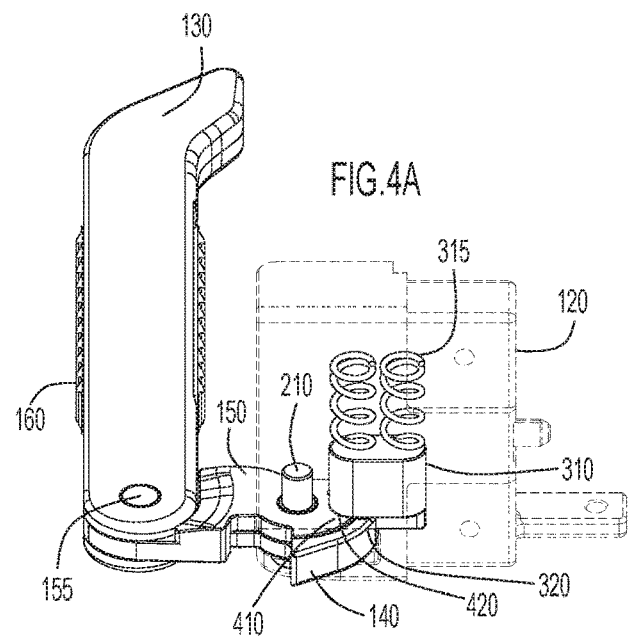
FIGS. 4A-4C illustrate stages of opening a locking mechanism, according to an example embodiment
Figure 4B:
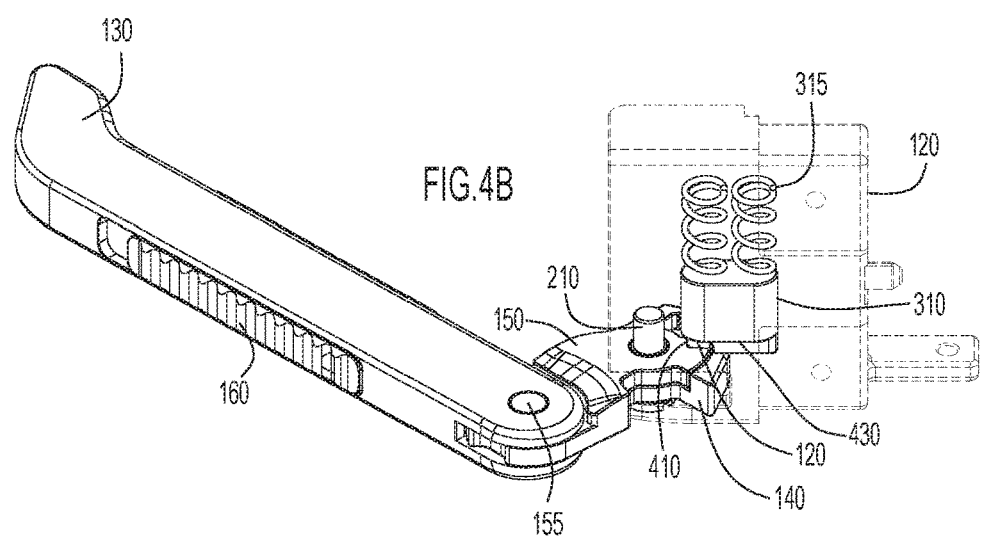
Figure 4C:
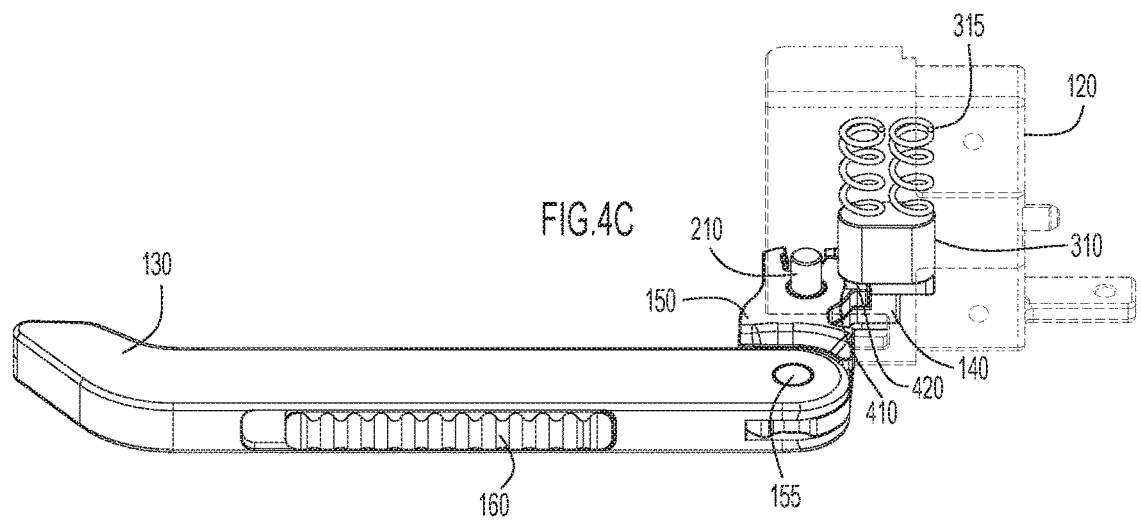

An example of releasing the jaw 140 from the enclosure is shown in FIGS. 4A-4C. Referring specifically to FIG. 4A, the arm 130 coupled to the transmission lever 150 is rotated in an opening direction to begin unlocking the jaw 140. To raise the wedge 310 from the wedge slot 320, the transmission lever 150 includes a wedge unlocking surface 410 that contacts an unlocking slope 420 on a portion of the wedge 310. The wedge 310 also includes a flat locking surface 430 that holds the jaw 140 in place while the wedge 310 is in the wedge slot 320. The unlocking slope 420 is positioned on the wedge 310 radially closer to the actuating pivot 210, and the wedge slot 320 of the jaw 140 extends further radially than the wedge unlocking surface (slope) 410 on the transmission lever 150. This configuration enables the jaw 140 to remain firmly locked in place until the wedge 310 is completely raised from the wedge slot 320, as shown in FIG. 4B.

In other words, small movements in the arm 130 and the transmission lever 150 may result in small up/down movements of the wedge 310, but these small movements are not translated into movement of the jaw 140, which remains locked in place against the enclosure. After the wedge 310 is completely raised out of the wedge slot 320, as shown in FIG. 4B, the arm 130 and transmission lever 150 continue to rotate about the actuating pivot 210, as shown in FIG. 4C. The rotation of the transmission lever 150 in the opening direction pushes the jaw 140 away from the enclosure, releasing the computing device attached to the locking mechanism 120 from the enclosure.

Figure 5:
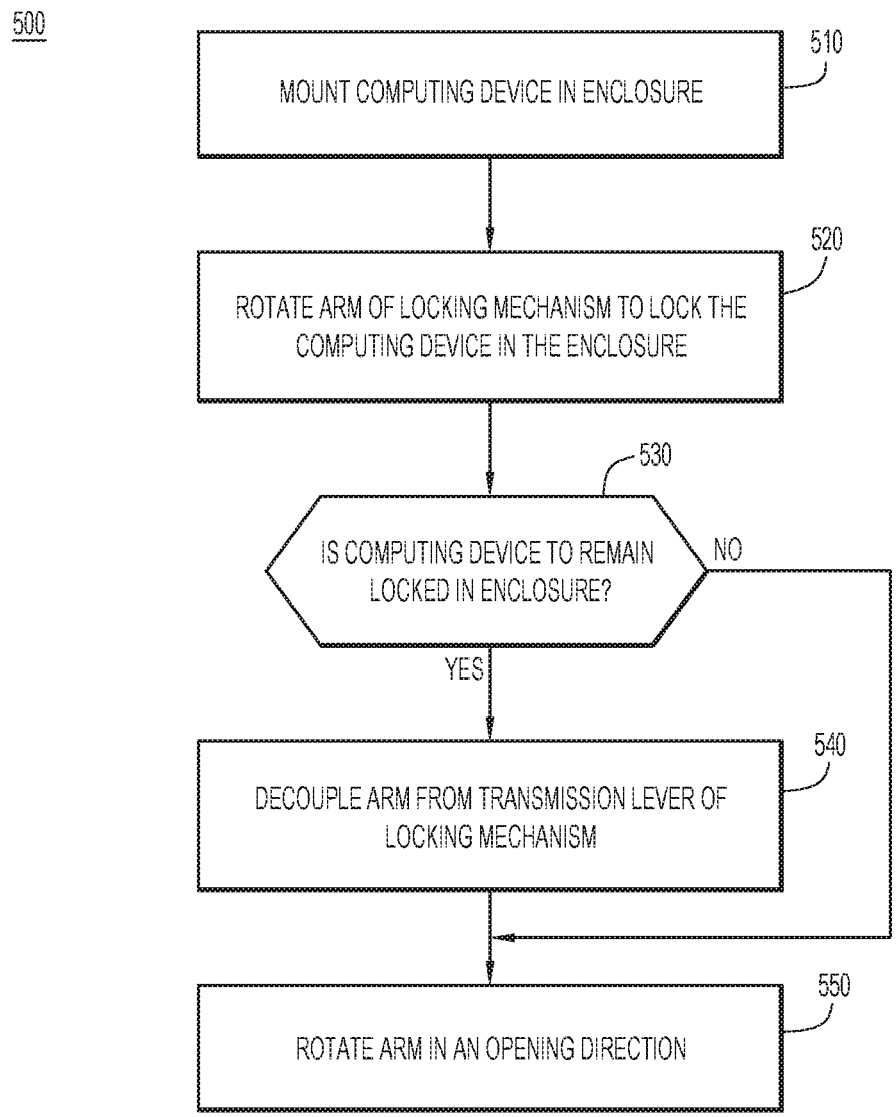
FIG. 5 is a flowchart illustrating operations for selectively decoupling an arm of a locking mechanism, according to an example embodiment.

Referring now to FIG. 5, a flowchart illustrates operations performed in a process 500 for selectively decoupling an arm (e.g., arm 130) from the rest of a locking mechanism (e.g., locking mechanism 120) to allow the arm to rotate. At 510, the computing device is mounted in an enclosure. In one example, the computing device may be a network device and the enclosure may be a chassis for holding multiple network devices. At 520, an arm of the locking mechanism is rotated in a closing direction to lock the computing device in the enclosure. In one example, the locking mechanism includes the arm, a jaw, and a transmission lever between the arm and the jaw. Rotating the arm in the closing direction actuates the transmission lever to secure the jaw against a portion of the enclosure.

If a user wants to selectively decouple the arm from the transmission lever and keep the computing device locked in the enclosure, as determined at 530, then the arm is decoupled from the transmission lever at 540. In one example, a slider on the arm may remove a pin in the arm from an actuating slot in the transmission lever to decouple the arm from the transmission lever. At 550, the arm is rotated in an opening direction that is opposite the closing direction. If the arm was selectively decoupled from the transmission lever at 540, then rotating the arm in the opening direction does not actuate the transmission lever. However, if the computing device is determined at 530 to be removed from the enclosure, then rotating the arm in the opening direction actuates the transmission lever to unlock the jaw from the enclosure and allow the computing device to be removed from the enclosure.

In summary, the techniques presented herein provide for a locking/ejector mechanism for securing computing devices into a chassis enclosure. The arm of the locking mechanism presented herein may be selectively decoupled from the rest of the locking mechanism to allow the arm to be repositioned without actuating the locking mechanism. The locking mechanism is self-locking with a wedge securing the jaw of the locking mechanism securing the computing device automatically when the jaw is moved to the locked position. The wedge maintains the position of the jaw after the arm is decoupled and opened. The decoupled arm may also include cable management features that are unavailable when the arm is in the closed position.

In one form, an apparatus comprising a jaw, a transmission lever, and an arm is provided. The jaw is configured to abut a portion of an enclosure for holding a computing device. The transmission lever comprises an arm pivot at a first end and an actuating pivot at a second end. The arm is configured to rotate about the arm pivot in an opening direction and a closing direction. The arm is also configured to be selectively decoupled from the transmission lever. When the arm is coupled to the transmission lever, rotating the arm in the opening direction causes the transmission lever to rotate in the opening direction about the actuating pivot. Rotating the transmission lever about the actuating pivot in the opening direction releases the jaw from the portion of the enclosure, and enables the computing device to be removed from the enclosure.

In another form, a system comprising a computing device and a locking mechanism is provided. The computing device is configured to be mounted in an enclosure. The locking mechanism is coupled to the computing device and includes a jaw, a transmission lever, and an arm. The jaw is configured to abut a portion of the enclosure. The transmission lever comprises an arm pivot at a first end and an actuating pivot at a second end. The arm is configured to rotate about the arm pivot in an opening direction and a closing direction. The arm is also configured to be selectively decoupled from the transmission lever. When the arm is coupled to the transmission lever, rotating the arm in the opening direction causes the transmission lever to rotate in the opening direction about the actuating pivot. Rotating the transmission lever about the actuating pivot in the opening direction releases the jaw from the portion of the enclosure, and enables the computing device to be removed from the enclosure.

In yet another form, a method is provided for opening an arm of a locking mechanism that secures a computing device in an enclosure, without releasing the locking mechanism. The method includes mounting the computing device in the enclosure and rotating an arm of the locking mechanism in a closing direction to lock the computing device in the enclosure. The locking mechanism also includes a transmission lever and a jaw. Rotating the arm of the locking mechanism actuates the transmission lever to secure the jaw against a portion of the enclosure. The method also includes selectively decoupling the arm from the transmission lever and rotating the arm in an opening direction opposite the closing direction without actuating the transmission lever.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus comprising:
   a jaw configured to abut a portion of an enclosure for holding a computing device;
   a transmission lever comprising an arm pivot at a first end and an actuating pivot at a second end, the arm pivot including an actuating slot and a detente angularly spaced from the actuating slot;
   an arm configured to rotate about the arm pivot in an opening direction and a closing direction, the arm being selectively decoupled from the transmission lever;
   a slider configured to selectively decouple the arm from the transmission lever, enabling the arm to rotate separately from the transmission lever when decoupled; and
   a pin coupled to the slider, wherein the actuating slot in the transmission lever captures the pin when the slider couples the arm to the transmission lever,
   wherein when the arm is selected to be coupled to the transmission lever to prevent the arm from rotating about the arm pivot, rotating the arm in the opening direction causes the transmission lever to rotate in the opening direction about the actuating pivot and releases the jaw from the portion of the enclosure, enabling the computing device to be removed from the enclosure, and
   wherein when the arm is selected to be decoupled from the transmission lever, rotating the arm in the opening direction causes the arm to rotate about the arm pivot without operating the transmission lever or the jaw.

2. The apparatus of claim 1, wherein the detente is configured to bias the arm away from the computing device when the pin engages the detente.

3. The apparatus of claim 2, wherein the arm pivot includes a plurality of angularly spaced detente features configured to bias the arm in a plurality of angularly spaced positions.

4. The apparatus of claim 1, further comprising a wedge configured to lock the jaw against the portion of the enclosure when the arm rotates in the closing direction.

5. The apparatus of claim 4, wherein the transmission lever includes an unlocking slope configured to contact an unlocking surface on the wedge, wherein rotating the arm in the opening direction when the arm is coupled to the transmission lever releases the jaw from the portion of the enclosure by forcing the unlocking slope of the transmission lever against the unlocking surface of the wedge.

6. A method comprising:
mounting a computing device in an enclosure, the computing device including a locking mechanism comprising an arm, a transmission lever with an arm pivot including an actuating slot and a detente angularly spaced from the actuating slot, a slider, a pin coupled to the slider, and a jaw;
selectively coupling the arm to the transmission lever by capturing the pin in the actuating slot to prevent the arm from rotating about the arm pivot;
rotating the arm in a closing direction to lock the computing device in the enclosure, wherein rotating the arm in the closing direction actuates the transmission lever to secure the jaw against a portion of the enclosure;
selectively decoupling the arm from the transmission lever by causing the slider to slide the pin in the arm to remove the pin from the actuating slot and allow the arm to rotate about the arm pivot; and
rotating the arm in an opening direction opposite the closing direction without actuating the transmission lever.

7. The method of claim 6, further comprising rotating the arm in the opening direction to allow the pin to engage the detente in the arm pivot angularly separated from the actuating slot in the arm pivot.

8. The method of claim 6, further comprising:
ratcheting the arm through a plurality of angularly spaced positions defined by a plurality of angularly spaced detente features configured to bias the arm in a plurality of angularly spaced positions.

9. The method of claim 6, wherein locking the computing device in the enclosure further comprises preventing the jaw from further rotation with a wedge.

10. The method of claim 9, further comprising:
coupling the arm to the transmission lever;
rotating the arm in the opening direction to force an unlocking slope of the transmission lever against an unlocking surface of the wedge; and
releasing the jaw from the portion of the enclosure to enable the computing device to be removed from the enclosure.

11. The apparatus of claim 1, wherein the arm pivot includes a plurality of angularly spaced detente features configured to bias the arm in a plurality of angularly spaced positions when the arm is decoupled from the transmission lever.

12. An apparatus comprising:
a jaw configured to abut a portion of an enclosure for holding a computing device;
a transmission lever comprising an arm pivot at a first end and an actuating pivot at a second end, the arm pivot including an actuating slot and a detente angularly spaced from the actuating slot;
an arm configured to rotate about the arm pivot in an opening direction and a closing direction;
a slider configured to selectively decouple the arm from the transmission lever, enabling the arm to rotate separately from the transmission lever when decoupled; and
a pin coupled to the slider, wherein the actuating slot in the transmission lever captures the pin when the slider couples the arm to the transmission lever,
wherein when the arm is coupled to the transmission lever, rotating the arm in the opening direction causes the transmission lever to rotate in the opening direction about the actuating pivot and releases the jaw from the portion of the enclosure, enabling the computing device to be removed from the enclosure, and
wherein the detente in the arm pivot is configured to bias the arm away from the computing device with the pin engages the detente.

13. The apparatus of claim 12, wherein the arm pivot includes a plurality of angularly spaced detente features configured to bias the arm in a plurality of angularly spaced positions.

14. The apparatus of claim 12, further comprising a wedge configured to lock the jaw against the portion of the enclosure when the arm rotates in the closing direction.

15. The apparatus of claim 14, wherein the transmission lever includes an unlocking slope configured to contact an unlocking surface on the wedge, wherein rotating the arm in the opening direction when the arm is coupled to the transmission lever releases the jaw from the portion of the enclosure by forcing the unlocking slope of the transmission lever against the unlocking surface of the wedge.

* * * * *